United States Patent [19]

Iwabushi

[11] 4,252,991
[45] Feb. 24, 1981

[54] MULTI-LAYER PRINTED CIRCUIT

[75] Inventor: Toshiyuki Iwabushi, Tokyo, Japan

[73] Assignee: Oki Electric Industry Co., Ltd., Tokyo, Japan

[21] Appl. No.: 61,072

[22] Filed: Jul. 26, 1979

Related U.S. Application Data

[63] Continuation of Ser. No. 887,768, Mar. 17, 1978, abandoned.

[30] Foreign Application Priority Data

Mar. 17, 1977 [JP] Japan .................. 52/28629

[51] Int. Cl.³ ............................................ H05K 01/02
[52] U.S. Cl. .................................. 174/68.5; 219/216; 219/543; 361/404; 361/406
[58] Field of Search ............... 219/216, 543; 174/68.5; 361/404, 406

[56] References Cited

U.S. PATENT DOCUMENTS

| 3,609,294 | 9/1971 | Cady | 219/216 |
|---|---|---|---|
| 3,632,970 | 1/1972 | Walkow | 219/216 |
| 3,965,330 | 6/1976 | Williams | 219/543 |

OTHER PUBLICATIONS

IEEE Transactions on Parts, Hybrids and Packaging, vol. PHP-12, No. 3, pp. 223-230, Sep. 1976.

Primary Examiner—Richard R. Kucia
Attorney, Agent, or Firm—Armstrong, Nikaido, Marmelstein & Kubovcik

[57] ABSTRACT

A multi-layer printed circuit applicable to a thermal printer head, having a plurality of parallel linear conductors with a heater and a diode in each conductors being classified into a plurality of groups and at least one end of the conductors in each group being connected together, said printed circuit comprising a first layer having an insulating substrate with a plurality of parallel linear conductors attached to said substrate, the terminated ends of the conductors in each group being arranged on an oblique line on the first layer, a second layer having a parallelogram-shape substrate portion with a plurality of parallel conductors on the surface of the same, each conductor on the second layer connecting each of the conductors in each group on the first layer to the corresponding conductors in the related group across some of the conductors on the first layer.

8 Claims, 10 Drawing Figures

MULTI-LAYER PRINTED CIRCUIT

This is a continuation of application Ser. No. 887,768, filed Mar. 17, 1978 now abandoned.

BACKGROUND OF THE INVENTION

The present invention relates to a multi-layer printed circuit, in particular, relates to a double layer printed circuit for use in a thermal printer head.

With the advent of computer technology and advances in the arts of data processing and/or data communication, facsimile communication, requirements for increased speed of information handling have become more stringent. One known type of rapid printing is a high speed thermal printer, which has at least a thermal head and a printing paper, and operates on the principle that a thermal head, heated to a high temperature according to the pattern of a desired character to be printed, selectively changes the color of a thermal paper or causes the thermal ink to be printed on paper. A thermal printer has the advantage that it can print not only a predetermined pattern of characters but also any pattern desired including pictures, Chinese characters and/or Arabian characters.

A thermal printer is a kind of a dot printer which composes the pattern to be printed with a plurality of dots, and a thermal head has a plurality of heat cells arranged, for instance, in a straight line of heat cells; said heat cells are selectively heated, thus the thermal paper reacts chemically, and the color of the thermal paper is selectively changed. Thus, the desired pattern is printed on said paper.

Because of the principle of dot printing, the density of dots in a thermal head must be very high to provide a clear print, that is, the length between each heaters in a thermal head must be very short. Since the thermal heads are provided on a printed circuit, the structure of the printed circuit might restrict the density of the heaters, thereby restricting the quality of the printed pattern. A prior printed circuit for a thermal head has a complicated printed pattern structure, and the density of such thermal heads can not be high. Another disadvantage of a prior printed circuit for a thermal head is that the size of the printed circuit is large compared with the available length of the thermal heads. Still another disadvantage of a prior printed circuit is that some conductors connected to the heaters sometimes short-circuit with other circuits due to the high density of the circuit.

SUMMARY OF THE INVENTION

It is an object, therefore, of the present invention to overcome the disadvantages and limitations of a prior multi-layer printed circuit by providing a new and improved printed circuit.

Another object of the present invention is to provide a multi-layer printed circuit which enables a high density of conductors on the printed circuit.

The present multi-layer printed circuit is applicable to a thermal printer head having a plurality of linear parallel conductors with a heater and a diode in each conductor, said conductors being classified into some groups and at least one end of the conductors in each group is connected to the other conductors in another group. The present multi-layer printed circuit comprises a first layer having an insulating substrate with a plurality of conductors selectively attached to the substrate, the terminated ends of the conductors in each group being arranged on an oblique line on the first layer, a second layer having a parallelogram-shape insulating substrate with a plurality of parallel conductors on the surface of the same, and each conductor on the second layer connecting each of the conductors in each group on the first layer to the corresponding conductors in the related group across some of the conductors on the first layer.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Although the present multi-layer printed circuit has many applications, the explanation below will be directed to the use in a thermal printer head, for the sake of the easy understanding of the present invention.

First, the structure of a thermal printer head and the prior multi-layer printed circuits will be explained in accordance with FIG. 1, FIG. 2, FIGS. 3(A) and 3(B) and FIGS. 4(A) and 4(B), for easy understanding of the present invention.

Figure 1:
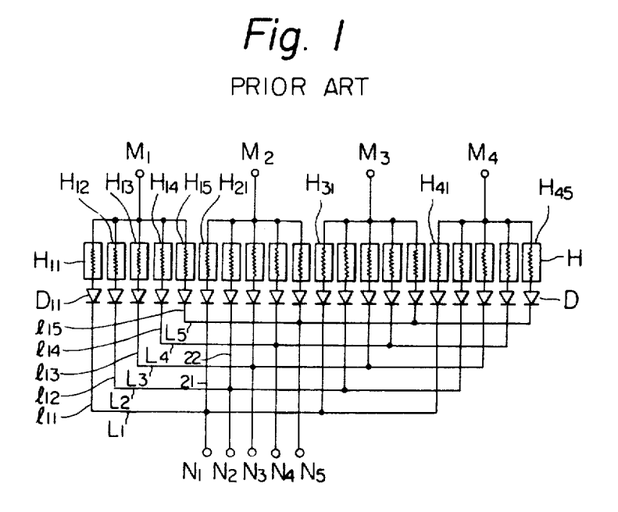
FIG. 1 shows the electrical circuitry of the thermal head which can be embodied on the printed circuit according to the present invention.

FIG. 1 shows the electrical circuitry of the thermal head. In the figure, $H_{mn}$ shows a heater for warming the thermal paper or thermal ink positioned linearly across the paper. The heaters $H_{mn}$ are classified into four groups $M_1$, $M_2$, $M_3$, and $M_4$ in the embodiment, and each group has five heaters. For instance, the first group $M_1$ has the heaters $H_{11}$, $H_{12}$, $H_{13}$, $H_{14}$, and $H_{15}$. The first figure m in the suffix $H_{mn}$ indicates the number of the group, and second figure n in the suffix $H_{mn}$ indicates the n'th heater in the group m. Each heater $H_{mn}$ is connected to one of the terminals $N_i$ ($N_1$, $N_2$, $N_3$, and $N_4$) through the related diode $D_{mn}$. The first heaters $H_{11}$, $H_{21}$, $H_{31}$, $H_{41}$ in each group are connected together at the terminal $N_1$. Similarly, the second, third, fourth, and the fifth heaters in each group are connected to the terminal $N_2$, $N_3$, $N_4$ and $N_5$ respectively, through the related diode.

It should be appreciated in FIG. 1, that the selection of one of terminals in $M_1$ through $M_4$ and the selection of one of terminals in $N_1$ through $N_5$ provide the selection of only one heater among twenty heaters. By providing an electrical current through a pair of selected terminals, the selected heater is heated and prints on the paper. In FIG. 1, it should be noted that only nine terminals ($M_1$ through $M_4$ and $N_1$ through $N_5$) provide the selection among twenty heaters.

The length between each heater is very short to provide clear printing on the dot printing principle, and according to the more practical embodiment, each group $M_i$ has 32 heaters, and 28 groups are provided, that is $32 \times 28 = 896$ heaters are provided, and the length between each heater is, for instance, 125 $\mu$m. However, FIG. 1 shows only twenty heaters for the sake of simplicity of the drawing.

It should be noted in FIG. 1 that each heater $H_{mn}$ is connected to the related terminal $N_n$ through the diode $D_{mn}$, the vertical line $l_{mn}$ and the horizontal line $L_n$, and it should be noted that the vertical line $l_{mn}$ crosses with the horizontal line $L_n$, although the vertical line $l_{mn}$ and the horizontal line $L_n$ must not be short-circuited except at the dotted point in the figure. In order to prevent the short-circuit between the vertical line $l_{mn}$ and the horizontal line $L_n$, a multi-layer printed circuit is required.

Figure 2:
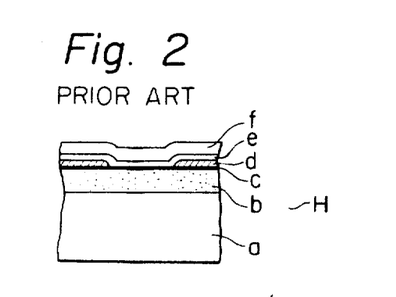
FIG. 2 is the cross sectional view of the heater of the thermal head in FIG. 1, FIG. 3(A) and FIG. 3(B) show the structure of a prior multi-layer printed circuit.

FIG. 2 shows the cross sectional view of the heater $H_{mn}$ in FIG. 1. In FIG. 2, the symbol (a) is a substrate made of alumina, (b) is the heat insulating layer, (c) is a heater line which is an electric resistor made of for instance $Ta_2 N$, (d) is a conductive lead for connecting the resistor to an outside circuit, (e) is a resistor protection layer, and (f) is a wear protection layer. The electrical current flows in the resistor line (c) and generates the heat for the thermal printing.

Figure 3A:
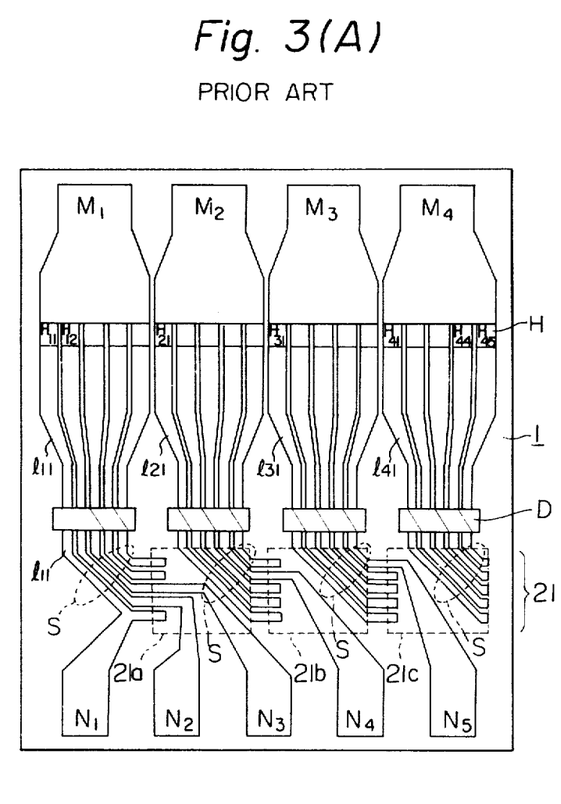
Figure 3B:
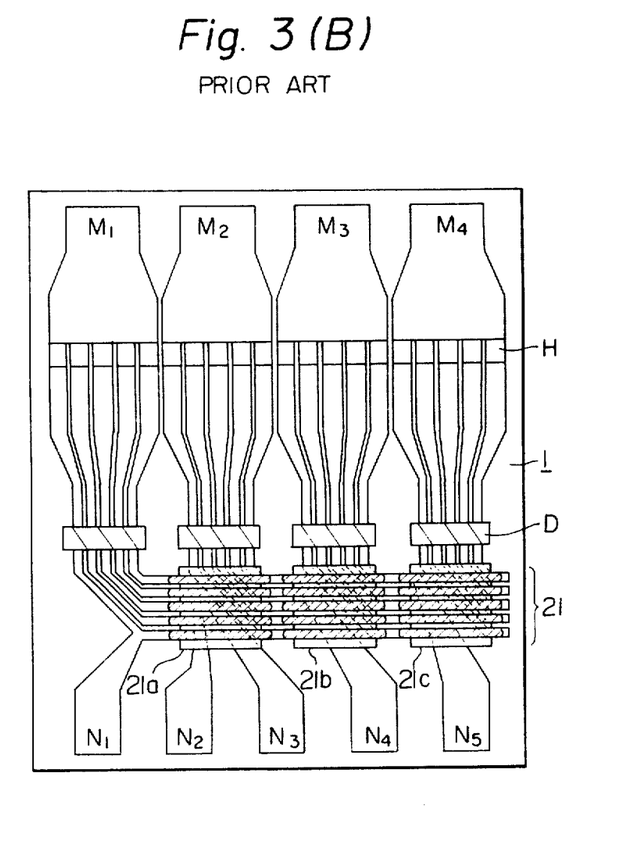

FIGS. 3(A) and 3(B) show the prior printed circuit for the thermal print head, and FIG. 3(A) shows only the first layer and FIG. 3(B) shows the assembled printed circuit having both the first layer and the second layer. In FIGS. 3(A) and 3(B), the reference numeral 1 shows the insulating substrate of the first layer. On the substrate 1, a plurality of vertical conductor lines $l_{mn}$ and the terminals $M_i$ and $N_j$ are provided, and the heaters H and the diodes D are connected to the vertical lines according to the circuit diagram in FIG. 1. The attachment of the vertical lines and the terminals on the substrate is accomplished through, for instance, the printing of a conductor, or photolithography. The rectangular second layers 21a, 21b and 21c provide the horizontal connections $L_n$. For instance, the first line $L_1$ on the second layer 21a provides the connection between the vertical line $l_{11}$ and $l_{21}$, the first line on second layer 21b provides the connection between the vertical lines $l_{21}$ and $l_{31}$. The first line on the second layer 21c provides the connection between the vertical lines $l_{31}$ and $l_{41}$. Thus, all the first vertical lines in all the groups $M_1$, $M_2$, $M_3$ and $M_4$ are connected together, and since the first line $l_{11}$ in the first group $M_1$ is connected to the terminal $N_1$ on the first layer as shown in FIG. 3(A), the first lines in all the groups are connected together to the terminal $N_1$. Similarly, the second lines in all the groups are connected together to the terminal $N_2$, through the second layers 21a, 21b and 21c. The third lines in all the groups are connected together to the terminal $N_3$, and the fourth lines and the lines and the fifth lines in all the groups are connected together to the terminals $N_4$ and $N_5$, respectively. The connection of the heater $H_{mn}$ and/or the diode $D_{mn}$ to the vertical line is accomplished through, for instance, thermo-compression bonding.

It should be appreciated that the connection between the terminals $M_i$ and the heaters belonging to the group $M_i$ can be accomplished only on the first layer, but the connection between the first line in each groups and the terminal $N_j$ is accomplished using both the first and the second layers.

Further, it should be noted that the vertical lines $l_{mn}$ have an oblique portion S in order to connect the vertical line to the horizontal line, and the angle between the line S and the vertical line or horizontal line is 45 degrees. And it should be noted from the Pythagorean theorem that the density of lines in the oblique portion S is $\sqrt{2}$ times as large as that of the vertical and horizontal portions, and the period between each line in the oblique portion S is $1/\sqrt{2}$ of that of the vertical and the horizontal portions. Since the maximum upper density of the lines or the conductors on a printed circuit is defined by the structure of the printed circuit, the presence of the oblique portion restricts the density of the heaters $H_{mn}$ thus restricting the clearness or distinctness of the printed documents.

Figure 4A:
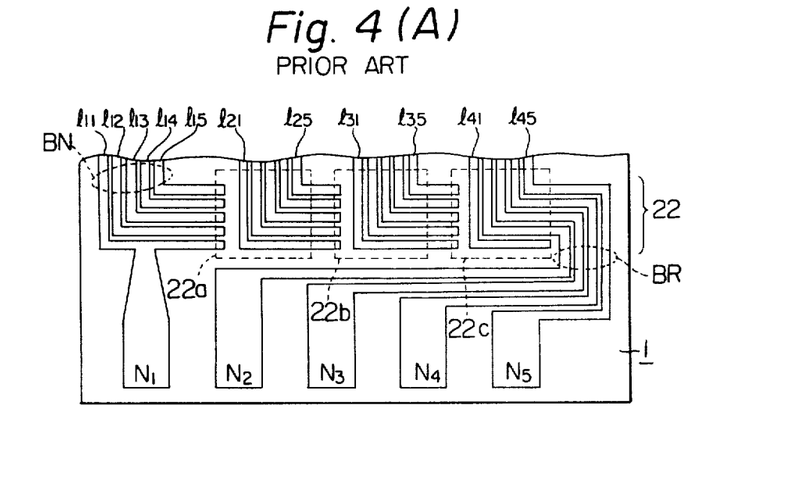
FIG. 4(A) and FIG. 4(B) show another structure of a prior multi-layer printed circuit.
Figure 4B:
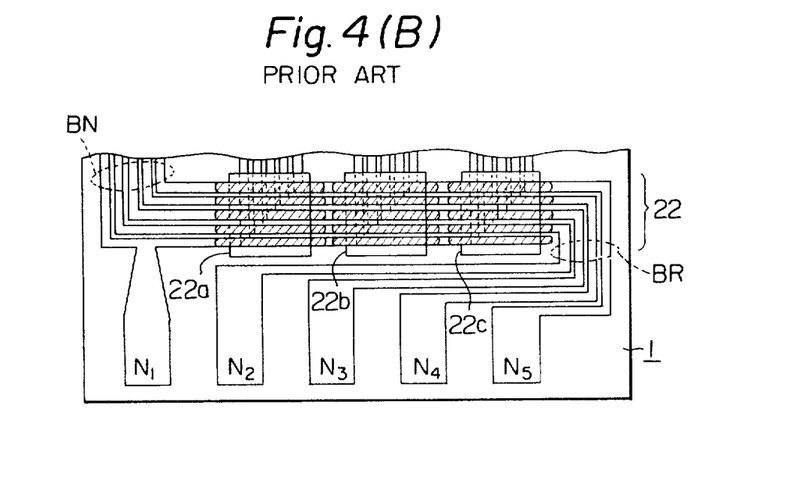

FIGS. 4(A) and 4(B) show another prior printed circuit which does not have an oblique portion. In those figures, FIG. 4(A) shows the pattern of the first layer and FIG. 4(B) shows the assembled structure having both the first layer and the second layers. However, both the figures show only the lower portion of the printed circuit for the sake of simplicity. In those figures, the first layer 1 has the vertical conduction lines $l_{mn}$ and the terminals $N_1$, $N_2$, $N_3$ and $N_4$. The vertical lines $l_{mn}$ have a perpendicular bend BN, and the bent portion of each lines $l_{mn}$ is connected together by the second layers 22 (22a, 22b, and 22c). The terminal $N_1$ is connected to the bent portion of the line $l_{11}$, but the terminals $N_2$, $N_3$, $N_4$, and $N_5$ are connected to the bent portions of the lines $l_{42}$, $l_{43}$, $l_{44}$ and $l_{45}$, through the cranked bridge portion BR. It should be appreciated that the presence of the bridge BR is inevitable to get rid of the short-circuit among the lines to the terminals $N_j$.

The disadvantage of the structure shown in FIGS. 4(A) and 4(B) is the presence of the bridge portion BR, which increases the width of the printed circuit, and it should be appreciated that the presence of the bridge portion BR prevents the continuous arrangement of the heaters when a plurality of printed circuits are positioned in order to facilitate a printing on a wider paper.

Accordingly, the present invention provides an improved printed circuit which overcomes the disadvantages of the prior multi-layer printed circuits.

Figure 5A:
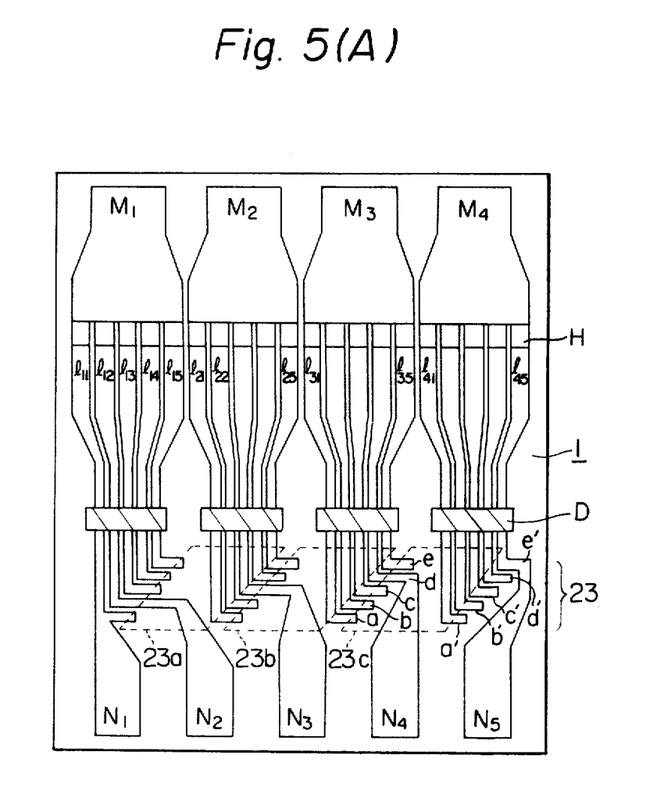
FIG. 5(A) and FIG. 5(B) show the structure of the multi-layer printed circuit according to the present invention.
Figure 5B:
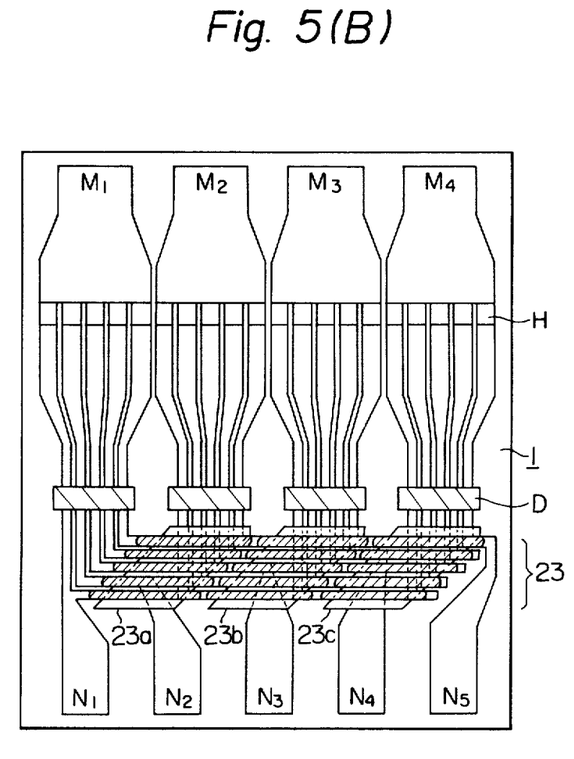
Figure 6:
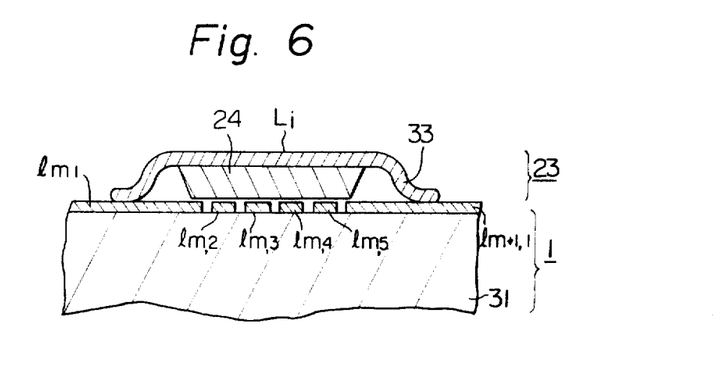
FIG. 6 shows the cross sectional view of the multi-layer printed circuit according to the present invention.
Figure 7:
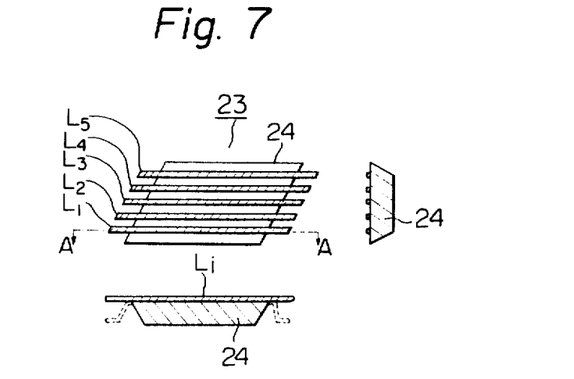
FIG. 7 shows the structure of the second layer for use in the present multi-layer printed circuit.

FIG. 5(A) shows the first layer of the present multi-layer printed circuit, FIG. 5(B) shows the structure of the present multi-layer printed circuit having both the first layer and the second layer, FIG. 6 is the cross sectional view of the present multi-layer printed circuit, and FIG. 7 shows the second layer according to the present invention.

In those figures, the reference numeral 1 is the insulating substrate of the first layer, and on the substrate 1 the terminals $M_1$ through $M_4$ and $N_1$ through $N_5$ and the vertical lines $l_{mn}$ are printed. The heaters H and the diodes D are attached on the vertical lines $l_{mn}$ through thermo compression bonding. The first lines in each group ($l_{11}$, $l_{21}$, $l_{31}$, $l_{41}$) are to be connected together by the second layer, and similarly, the second, third, fourth, and fifth lines in each group are connected respectively by the second layer. It should be appreciated that the second layer connections between the lines $l_{11}$ and $l_{21}$ must cross the line $l_{12}$ and/or the terminal $N_2$ without short-circuited with the line $l_{12}$.

As shown in FIG. 5(A), the terminated or other ends of the vertical lines $l_{mn}$ extend horizontally and are arranged on an oblique line, the horizontal portion forming a bonding portion and accordingly, the shape of the second layer which connects each of the terminated ends of the group to the corresponding terminated ends of the next group, is a parallelogram. One pair of parallel sides of the parallelogram are parallel to the oblique lines of the terminated ends as shown in FIG. 5(A). The first second layer 23a connects the lines of the first group $M_1$ to those of the second group $M_2$, the second layer 23b connects the lines of the second group $M_2$ to those of the third group $M_3$, and the third layer 23c connects the lines of the third group $M_3$ to those of the fourth group $M_4$, respectively. For instance, the terminated end (a), (b), (c), (d), and (e) of the lines $l_{31}$, $l_{32}$, $l_{33}$, $l_{34}$ and $l_{35}$ in the third group are connected to the terminated ends (a'), (b'), (c'), (d'), and (e') of the lines $l_{41}$, $l_{42}$, $l_{43}$, $l_{44}$, and $l_{45}$ of the fourth group by the second layer 23c.

The shape of the second layer, which is a parallelogram, is one of the important features of the present invention. It should be noted that the present printed circuit does not have an oblique conductor like the embodiment in FIG. 3(A) nor the bridge portion at the side of the substrate like the embodiment in FIG. 4(A).

The production steps of the present multi-layer printed circuit are explained below. First, the first conducting lines $l_{m1}$, $l_{m2}$, $l_{m3}$, $l_{m4}$ and $l_{m5}$ are attached to the insulating board 31 through the photolithography and/or the vacuum deposition process, thus providing the first layer 1 (see FIG. 6). The second layer 23 has the glass substrate 24 and a plurality of conducting lines $L_i$. The conductors $L_i$ are provided on the surface of the substrate 24 through the photolithography and/or the vacuum deposition process, the glass substrate 24 is the shape of a trapezoid as shown in FIG. 7 by removing the end portion of the glass substrate through the photoetching process. The connection of the second layer to the first layer is accomplished by connecting the ends of the conductors of the second layer to the bonding portion of the conductors of the first layer through thermo compression bonding. When the second layer is attached to the first layer, the extreme ends of conductors on the second layer are curved as shown by the dotted line in FIG. 7. In order to facilitate the thermo compression binding, it is preferable that the conductors on both the first layer and the second layer are plated with gold.

Some modifications for producing second layer are possible. For instance, the second layer could be produced by the steps of attaching a copper film to an insulating polyimide-film of trapezoid shape, plating the copper film with gold, and connecting the second layer to the first layer through thermo compression bonding. Further, the second layer can be produced by the steps of attaching a copper film to an insulating polyimide-film, and attaching a polyester film of trapezoid shape to the copper film, and connecting the copper film to the first layer by sandwiching the polyester film between the first and the second layers.

As explained above, according to the present invention, due to the shape of the second layer which is parallelogram, the vertical conductors on the first layer do not suffer from an oblique portion or a bridge portion, and the terminals $N_j$ can be connected to the vertical conductors under the second layer. And due to the parallelogram shape of the second layer, the density of the wiring on the first layer can be increased. Thus, the present printed circuit can be applicable to a thermal head with high density of heaters.

From the foregoing it will now be apparent that a new and improved multi-layer printed circuit has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A multi-layer printed circuit comprising a first layer having an insulating substrate with a plurality of conductors selectively attached to said substrate, said conductors running substantially in a first direction on the substrate, said plurality of conductors being classified into groups, and at least two of the conductors in each group being connected together at one end, the other end of each conductor in each group extending in a second direction perpendicular to the first direction to provide a bonding portion for the connection with a second layer, the length of said bonding portion in the second direction being longer than the distance between each conductor, the bonding portions of said conductors in each group being aligned with respect to one another such that the other ends of the conductors in each group are arranged on a line oblique to the first and second directions on the first layer, the second layer having a parallelogram-shaped substrate with acute angles formed at diagonally opposite corners thereof, said second layer including a plurality of parallel conductors on the surface of said substrate, one pair of parallel sides of said parallelogram being parallel to the oblique lines of the other ends of the conductors, wherein each conductor on the second layer connects each of the conductors in each group on the first layer to the corresponding conductors in the related group, said conductors of said second layer being connected to said bonding portion of said conductors of said first layer.

2. The invention as defined in claim 1, wherein at least the surface of the conductors on the second layer is gold.

3. The invention as defined in claim 1, wherein the material of the conductors on the second layer is copper.

4. The invention as defined in claim 1, wherein the material of the substrate of the second layer is glass.

5. The invention as defined in claim 1, wherein the material of the substrate of the second layer is polyimide-film.

6. The invention as defined in claim 1, wherein the material of the substrate of the second layer is polyester.

7. The invention as defined in claim 1, wherein the conductors on the second layer extend beyond the edge of the substrate.

8. The invention as claimed in claim 1, wherein the conductors on the second layer are covered with dielectric film when assembled.

* * * * *